United States Patent
Hewitt

[11] Patent Number: 5,794,021
[45] Date of Patent: Aug. 11, 1998

[54] VARIABLE FREQUENCY CLOCK GENERATION CIRCUIT USING APERIODIC PATTERNS

[75] Inventor: Larry D. Hewitt, Austin, Tex.

[73] Assignee: Advanced Micro Devices, Inc., Sunnyvale, Calif.

[21] Appl. No.: 483,619

[22] Filed: Jun. 7, 1995

Related U.S. Application Data

[63] Continuation-in-part of Ser. No. 333,451, Nov. 2, 1994, abandoned.

[51] Int. Cl.$^6$ .................................................. G06F 1/08
[52] U.S. Cl. .................... 395/556; 327/270; 327/291
[58] Field of Search ........................... 395/550, 555, 395/556; 377/47, 48, 52; 328/18, 61, 63; 327/265, 270, 273, 279, 291, 298, 286, 144, 160

[56] References Cited

U.S. PATENT DOCUMENTS

| | | | |
|---|---|---|---|
| 4,124,989 | 11/1978 | Munter | 327/144 |
| 4,317,221 | 2/1982 | Toya | 455/76 |
| 4,318,045 | 3/1982 | Krupa et al. | 328/18 |
| 4,344,036 | 8/1982 | Darkroub et al. | 327/160 |
| 4,623,846 | 11/1986 | LaMacchia | 328/61 |
| 4,746,899 | 5/1988 | Swanson et al. | 340/347 |
| 4,750,111 | 6/1988 | Crosby, Jr. et al. | 364/200 |
| 4,757,264 | 7/1988 | Lee et al. | 328/63 |
| 4,800,524 | 1/1989 | Roesgen | 364/900 |
| 4,805,198 | 2/1989 | Stern et al. | 375/118 |
| 4,823,312 | 4/1989 | Michael et al. | 364/900 |
| 4,829,473 | 5/1989 | Keller et al. | 364/900 |
| 4,918,339 | 4/1990 | Shigeo et al. | 307/542 |
| 4,935,944 | 6/1990 | Everett | 377/48 |
| 4,947,411 | 8/1990 | Shiraishi et al. | 377/47 |
| 4,998,075 | 3/1991 | Patton, III et al. | 327/141 |
| 5,065,415 | 11/1991 | Yamashita | 377/52 |
| 5,124,579 | 6/1992 | Naghshineh | 307/443 |
| 5,140,679 | 8/1992 | Michael | 395/325 |
| 5,150,386 | 9/1992 | Stern et al. | 375/118 |
| 5,167,031 | 11/1992 | Watanabe | 395/550 |
| 5,199,105 | 3/1993 | Michael | 395/275 |
| 5,218,239 | 6/1993 | Boomer | 307/443 |
| 5,233,309 | 8/1993 | Spitalny et al. | 330/84 |
| 5,280,595 | 1/1994 | Lemay et al. | 395/425 |
| 5,287,296 | 2/1994 | Bays et al. | 364/703 |
| 5,287,457 | 2/1994 | Arimilli et al. | 395/200 |
| 5,287,470 | 2/1994 | Simpson | 395/425 |
| 5,289,584 | 2/1994 | Thome et al. | 395/325 |
| 5,299,315 | 3/1994 | Chin et al. | 395/250 |
| 5,303,326 | 4/1994 | Dean et al. | 395/2 |
| 5,359,232 | 10/1994 | Eitrheim et al. | 307/268 |
| 5,371,772 | 12/1994 | Al-Khairi | 377/47 |
| 5,477,181 | 12/1995 | Li et al. | 327/258 |

OTHER PUBLICATIONS

Samsung Semiconductor OmniWave™ Multimedia Audio KS0161, Rev. A, Nov. 1994.

OPTi/MediaCHIPS Multimedia Audio Controller 82C929, Mar. 29, 1993 Spec Sheet.

Analog Devices Parallel–Port 16–Bit SoundPort Stereo Codec AD 1848, Rev. A.

Crystal Semiconductor Corporation Parallel Interface, Multimedia Audio Codec CS–4231 Mar. 1993.

*Primary Examiner*—Dinh C. Dung

[57] ABSTRACT

A method and circuit for generating a selectively variable clock signal from one of 256 frequencies within a specified range from two fixed frequency oscillator source signals is provided. The method and circuitry maintain a substantially fifty-percent duty cycle in the output clock signal.

7 Claims, 2 Drawing Sheets

5,794,021

VARIABLE FREQUENCY CLOCK GENERATION CIRCUIT USING APERIODIC PATTERNS

CROSS-REFERENCE TO RELATED APPLICATION

The present application is related to and a continuation-in-part of the U.S. patent application Ser. No. 08/333,451, entitled "Monolithic PC Audio Circuit," filed on Nov. 2, 1994, (abandoned) which is assigned to the assignee hereof. Applicant claims the benefit of the filing date of this prior application under 35 U.S.C. § 120 for common subject matter contained therein.

BACKGROUND OF THE INVENTION

1. Field of the Invention.

The present invention relates to circuits and methods for providing a clock signal of selectively variable frequency derived from one or more fixed or base frequency clock signals. The base or fixed frequency signals are provided by one or more oscillators. The circuit and method of the present invention are particularly useful for providing selectively variable clock signals for setting sampling rates used in analog-to-digital or digital-to-analog conversion circuits such as are used in sophisticated audio systems for personal computers or other such applications.

In sophisticated audio systems, it is desirable to provide a highly variable sampling rate to achieve accurate audio signal conversion, effects processing and playback. In audio applications, it is desirable to have greater resolution at the lower end of the spectrum (i.e., 400–500 Hz) where relatively minor variations in sampling rates produce noticeable audio effects.

It is also desirable to maintain the duty cycle of the sampling rate signal as close to fifty percent as possible to avoid distortion in analog audio signals processed or generated by digital-to-analog conversion circuitry.

2. Brief Description of the Related Technology.

Prior art circuits and methods provided only a limited number of selectively variable sampling rates—typically twelve to fourteen selectable rates over an extended range. Such systems were inadequate for sophisticated audio signal processing where increased resolution is required to avoid audible distortion or noticeable pitch transitions in the analog signal. Prior art systems typically used a base oscillator signal which was selectably divided or multiplied to produce one of twelve to fourteen sampling rates for digital processing and conversion.

SUMMARY OF THE INVENTION

The system of the present invention provides a digital clock signal which can be used to set the sampling rate of an audio processing circuit at one of up to 256 different rates while maintaining a near fifty-percent duty cycle in a sampling rate clock. The system of the present invention provides an expanded range of selectable sampling rates and thus, higher resolution between selectable rates, from fixed frequency signals provided by two external oscillators. The system of the present invention produces the clock signal of the selected frequency or sampling rate by providing an output signal which is a weighted average of a combination of two input natural frequency signals. The natural or regular frequency input signals are provided by dividing down one or more base oscillator signals in the conventional manner. Compatibility with prior art systems is maintained by making the conventional twelve to fourteen natural frequency sampling rates available via clocking signals derived from conventional divide down logic.

BRIEF DESCRIPTION OF THE DRAWINGS

The above and other objects, features and methods of the invention will be apparent to one familiar with the art from the description of the preferred embodiment of the invention with reference to the accompanying drawings in which.

DETAILED DESCRIPTION OF THE PREFERRED EMBODIMENTS

The preferred embodiment of the present invention is particularly useful in digital audio processing circuits for personal computers or similar applications. Throughout this specification where reference is made to registers, state machines or other logic circuits to control the generation and selection of specific sampling rates or clock signals the specific manner or means of providing such logic circuits or registers is not critical to the claimed invention and have not been described in detail herein. Details of register definitions in a computer audio circuit application are set forth in U.S. patent application Ser. No. 08/333,451, referenced above and incorporated by reference herein for all purposes.

Throughout this specification, references to registers or other circuitry by specific mnemonics is consistent with those used in the parent application where appropriate but have no limiting effect on the scope of the present invention. As used herein, X64 refers to a digital pulse or clock signal having a frequency which is sixty-four times that of the desired sampling rate. Likewise, X256 is a clock signal having a nominal frequency 256 times the selected sampling frequency.

Figure 1:
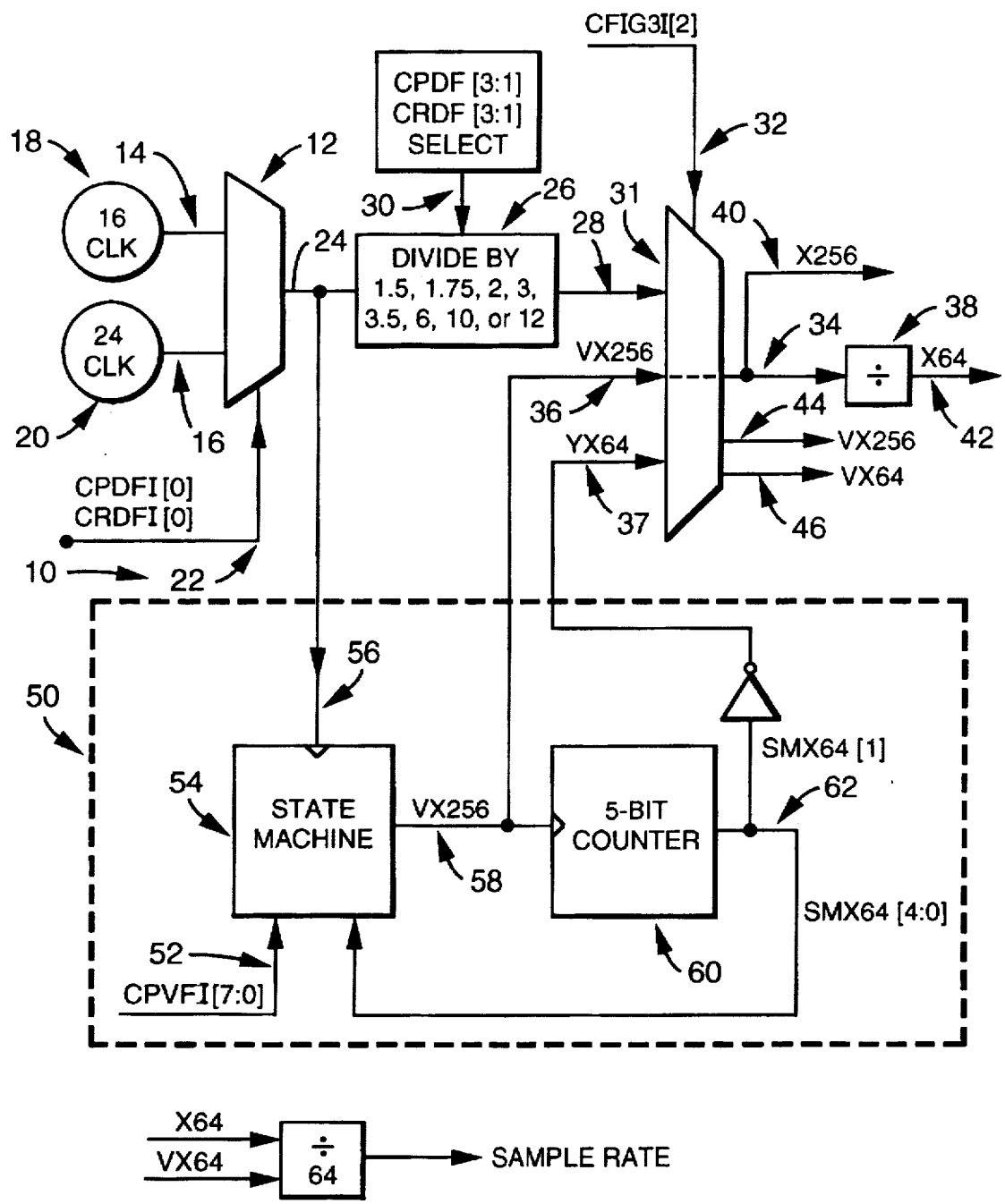
FIG. 1 is a schematic block diagram of the clock generation circuit of the present invention.

Referring now to FIG. 1, a basic block diagram of the preferred embodiment of clock generation circuit 10 is illustrated. Circuit 10 includes a 2:1 multiplexer 12 which receives selectable inputs 14 and 16 from digital clock sources 18 and 20. In the preferred embodiment, clock inputs 18 and 20 provide regular digital clock signals having nominal frequencies of 16.9344 MHz and 24.576 MHz, respectively. Selected output of multiplexer 12 is controlled by the status of bit zero of a register designated CPDFI[0] provided on control input 22. Thus, either the 16 MHz or 24 MHz clock input is provided as an output 24, depending on the state of bit zero of register CPDFI.

To maintain compatibility with prior art systems and to provide standard sampling rates used in audio processing, the circuit 10 provides divide logic 26 which receives either the 16 MHz or 24 MHz input from multiplexer 12. Divide logic 26 provides an output on line 28 which is a clock signal having one of fourteen selected frequencies ranging from 5.5 KHz to 48 KHz in the illustrated embodiment. The specific frequencies of the selectable clock signals can be altered by changing the clock input frequency or the divide logic, or both, as necessary to provide the desired output signal.

In the preferred embodiment, the selected one of fourteen frequencies or sample rates is controlled by bit zero of register CPDFI which selects either the 16 MHz or 24 MHz clock input, and by the status of another threebits of register CPDFI|3:1| which is provided as a divide select signal to logic 26 on line 30.

The state of CPDFI|3:1| selects one of eight divisors from the group 1.5, 1.75, 2, 3, 3.5, 6, 10 or 12 which is applied to either the 16 MHz or 24 MHz input clock to produce the desired output on line 28. This output is provided as one of two inputs to multiplexer 31. Multiplexer 31, under the control of the state of bit two of register CFIG3I on line 32, provides an output on line 34 which is either input 28 or the variable X256 and X64 inputs discussed in detail below. Where it is desired to provide industry compatible sampling rates from the fourteen in the prescribed range, CFIG3I|2| is set to pass input 28 through to output 34. The output 34 of multiplexer 31 is provided to a divide by four circuit 38 which produces the X64 clock signal having a frequency one-fourth of that of the X256 signal. The X64 signal has a frequency of sixty-four times the desired sampling rate and is further divided to provide the sampling rate clock as required in the specific application. Where more resolution between sampling rates is required, the variable VX256 and VX64 inputs on lines 36 and 37 are selected and passed to outputs 44 and 46, respectively.

Referring still to FIG. 1, the circuit 10 includes a higher resolution selectively variable frequency clock generator sub-circuit 50. Circuit 50 produces highly variable frequency signals VX256 and VX64 at output lines 36 and 37, respectively. Variable frequency mode for the circuit 10 is enabled via the state of CFIG3I|2| which causes multiplexer 31 to pass VX256 and VX64 to outputs 44 and 46. In this mode, the frequency of the clock signal can be varied more contiguously, thereby providing greater resolution for more sophisticated or higher performance systems or applications.

In the preferred embodiment, the frequency of output signal VX64 can be varied in 256 steps over each of two ranges, depending on which oscillator or clock source 14 or 16 is chosen via multiplexer 12. As will be described in detail below, the selected output frequency within a specified range is controlled by the value stored in an eight-bit register designated CPVFI|7:0|. Note that while input 52 to state machine 54 is shown as a single line for simplicity, it represents an eight-bit input. Note also that while CPVFI |7:0| has been designated an eight-bit register in the preferred embodiment to provide 256 steps of resolution, larger or smaller steps in the range could be provided by decreasing or increasing the size of register CPVFI.

In the illustrated embodiment, the output signal VX64 is sixty-four times that of the desired sample rate. The desired sample rate signal is readily obtained by dividing either X64 or VX64 as illustrated in FIG. 1. The range of selectable sample rates possible in the preferred embodiment depending on the choice of oscillator are as follows:

| Oscillator | Sample Rate Range | Formula |
| --- | --- | --- |
| 16.9344 MHz | 3.5 KHz to 22.05 KHz | 16,934,000/(16*(48 + CPVFI)) |
| 24.576 MHz | 5.0 KHz to 32.00 KHz | 24,576,000/(16*(48 + CPVFI)) |

The formula is the oscillator frequency divided by sixteen times the sum of forty-eight plus the value of frequency control register CPVFI.

To implement the high-resolution, variable frequency sample rates, a state machine 54 is provided which receives either the 16 MHz or 24 MHz basic clock signal as an input on line 56 from multiplexer 12 and generates the VX256 output at line 58. The VX256 clock is provided to a five-bit counter 60 which provides a five-bit output designated SMX64|4:0| on line or bus 62. The value of SMX64|4:0| cycles repeatedly from zero to thirty-one and is fed back to state machine 54. Inverting SMX64|1|) on line 37 provides the desired VX64 signal which represents VX256 divided by four.

State machine 54 decodes CPVFI|7:0| which represents one of the 256 values for the selected sample rate which remains constant for a given VX64 cycle. State machine 54 decodes SMX64|4:0| to determine the variable number of input oscillator clocks to require for a given output VX256 clock cycle. The input oscillator signal is thereby divided by three or more depending on the selected sample rate (CPVFI), and the count reflected by the value of SMX64 |4:0| which changes cyclically with each VX256 cycle.

By implementing the state machine algorithm described below, the VX64 signal is caused to repeat an eight-cycle, aperiodic pattern to achieve a composite or average frequency equal to the desired sample rate. By selectively varying the number of base oscillator clocks per VX256 output clock over an eight-cycle pattern for the VX64 signal the circuit 10 produces an output VX64 signal having a variable wavelength within each group of eight VX64 cycles or periods. Thus, the preferred embodiment provides seven steps between natural frequencies. The steps are generated by the repeating eight-cycle pattern that consist partly of the lower frequency and partly of the adjacent higher frequency. For example, in the following table, the highest frequency is shown to be wholly 12 oscillator clocks per X64 clock (CPVFI=00h); the next lower natural frequency is wholly 14 oscillator clocks per X64 clock (CPVFI=08h); the steps in between are created by increasing the share of the lower natural frequency and thereby decreasing the average overall frequency.

| CPVFI | Number of osc clocks per X64 cycle based on SMX64[4:2] | | | | | | | | Frequency for 16.9 MHz osc. |
| --- | --- | --- | --- | --- | --- | --- | --- | --- | --- |
| | 0 | 1 | 2 | 3 | 4 | 5 | 6 | 7 | |
| 00 h | 12 | 12 | 12 | 12 | 12 | 12 | 12 | 12 | 22.050 KHz |
| 01 h | 14 | 12 | 12 | 12 | 12 | 12 | 12 | 12 | 21.600 KHz |
| 02 h | 14 | 14 | 12 | 12 | 12 | 12 | 12 | 12 | 21.168 KHz |
| 03 h | 14 | 14 | 14 | 12 | 12 | 12 | 12 | 12 | 20.753 KHz |
| 04 h | 14 | 14 | 14 | 14 | 12 | 12 | 12 | 12 | 20.353 KHz |
| 05 h | 14 | 14 | 14 | 14 | 14 | 12 | 12 | 12 | 19.970 KHz |
| 06 h | 14 | 14 | 14 | 14 | 14 | 14 | 12 | 12 | 19.600 KHz |
| 07 h | 14 | 14 | 14 | 14 | 14 | 14 | 14 | 12 | 19.244 KHz |
| 08 h | 14 | 14 | 14 | 14 | 14 | 14 | 14 | 14 | 18.900 KHz |
| 09 h | 16 | 14 | 14 | 14 | 14 | 14 | 14 | 14 | 18.568 KHz |

At the highest sample rate, the oscillator input is simply divided by three to create the VX256 clock which is divided by four to create the VX64 clock.

To create the variable VX64 waveform, the VX256 clock state machine 54 implements the following four-cycle pattern based upon decoding SMX64|1:0|:

| SMX64|1:0| | Number of osc clocks per X256 cycle |
| --- | --- |
| 0 | 3 + CPVFI[7:4] + (1 if ((SMX64[4:2] < CPVFI[2:0]) AND (CPVFI[3] = 0))) + (1 if (CPVFI[3] = 1)) |
| 1 | 3 + CPVFI[7:4] + (1 if ((SMX64[4:2] < CPVFI[2:0]) AND (CPVFI[3] = 1))) |
| 2 | 3 + CPVFI[7:4] + (1 if ((SMX64[4:2] < CPVFI[2:0]) AND (CPVFI[3]|= 0))) + (1 if (CPVFI[3] = 1)) |

-continued

| SMX64[1:0] | Number of osc clocks per X256 cycle |
|---|---|
| 3 | 3 + CPVFI[7:4] + (1 if ((SMX64[4:2] < CPVFI[2:0]) AND (CPVFI[3] = 1))) |

Notice that cycles 0 and 1 are the same as cycles 2 and 3. This ensures that the X64 clock will always maintain a fifty-percent duty cycle.

The pattern of wavelength variation in the VX64 clock signals between natural frequencies is such that one additional oscillator clock is added to each VX64 half-cycle to maintain the duty cycle of VX64 as near to fiftypercent as possible. The relationship of the various input and output signals is illustrated in FIG. 2.

Figure 2:
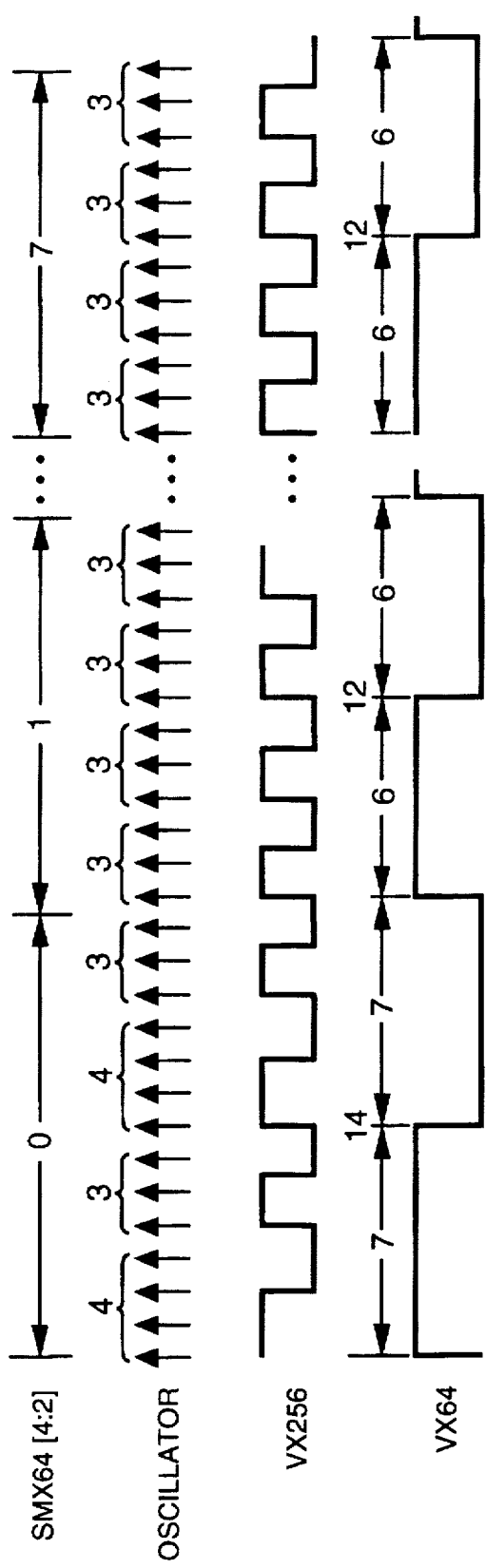
FIG. 2 is a timing diagram illustrating the relationship between base oscillator clock pulses and other circuit signals and variables.

Referring now to FIG. 2, the relationship between referenced signals is illustrated for a selected sample rate of 21.600 KHz (CPVFI=01h). As SMX64[4:2] counts from zero to seven, the number of oscillators clocks required for each VX256 output varies according to the above state machine algorithm. This causes the period of VX64 to include 14 oscillator cycles when SMX64[4:2] equals zero, and twelve in each of the remaining seven counts of SMX64. Note that one oscillator clock is added to each half-cycle of VX64 to maintain a fifty-percent duty cycle. The realized or resultant average frequency of VX64 is as follows:

$$f = 1/\omega = 1/\omega \text{ average}$$

$$\omega \text{ average} = \sum_{o}^{\eta} \omega i/8$$

$$f \text{ average} = 8/\sum_{o}^{\eta} \omega i$$

Figure 3:
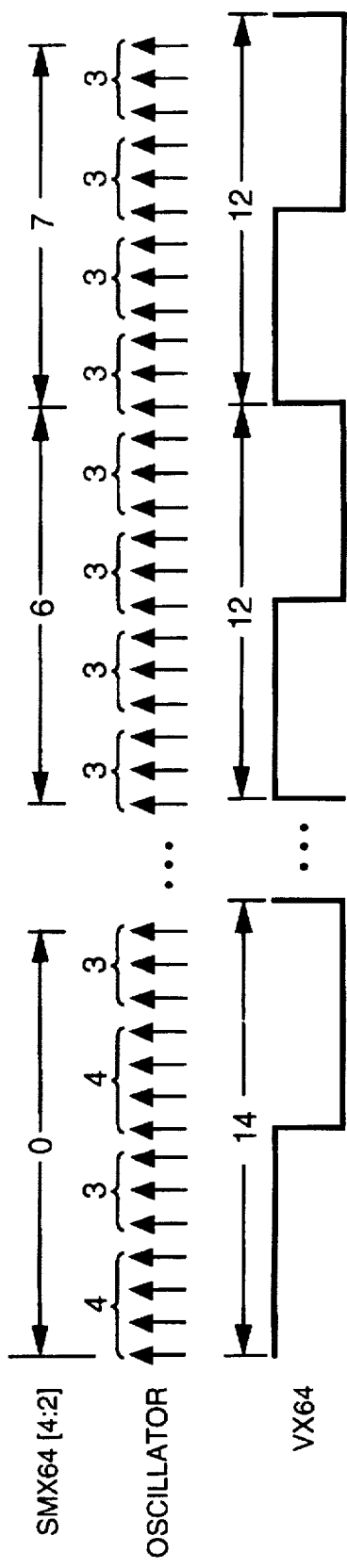
FIG. 3 is a timing diagram illustrating the relationship between base oscillator clock pulses and other circuit signals and variables.

As oscillator clocks are added in increments of two as the value of CPVFI is incremented to vary the sample rate, the average frequency of VX64 over a given eight-cycle pattern gradually increases from one entirely natural frequency to the next. FIG. 3 shows the relationship between oscillator clocks and VX64 for CPVFI equal to six.

The present invention, therefore, is well adapted to carry out the objects and attain the ends and advantages mentioned herein as well as other ends and advantages made apparent from the disclosure. While preferred embodiments of the invention have been described for the purpose of disclosure, numerous changes and modifications to those embodiments described herein will be readily apparent to those skilled in the art and are encompassed within the spirit of the invention and the scope of the following claims.

What is claimed is:

1. A circuit for providing a selectively variable clock signal comprising:

a base oscillator source for providing a fixed frequency input oscillator signal;

a state machine for generating selectable aperiodic patterns corresponding to a plurality of selectable frequencies for the output clock signal, wherein said aperiodic patterns are comprised of a plurality of variable period cycles and wherein the number of oscillator cycles per pattern cycle is varied depending on the selected frequency for the clock signal; and a divider circuit for dividing an aperiodic pattern by the number of variable period cycles comprising the aperiodic pattern and providing the quotient signal as the output clock signal.

2. The circuit of claim 1, wherein said base oscillator source further comprises:

a plurality of base oscillator sources for providing a plurality of fixed-frequency input oscillator signals; and an oscillator input selection circuit for selecting one of said plurality of input oscillator signals.

3. The circuit of claim 1, wherein said state machine further comprises:

a clock frequency select register for selecting one of a plurality of output clock signal frequencies; and a multiple-bit counter circuit for counting intermediate output clock pulses of said state machine to define the cycles which comprise the aperiodic pattern.

4. A method of providing a selectively variable clock signal, said method comprising:

providing a base oscillator input signal having a fixed frequency;

defining selectable aperiodic patterns corresponding to a plurality of selectable frequencies for the clock signal; said aperiodic patterns being comprised of a plurality of variable period cycles wherein the number of oscillator cycles per pattern cycle is varied depending on the selected frequency for the clock signal;

dividing an aperiodic pattern by the number of variable period cycles to provide an output clock signal having a frequency which is the average frequency of the variable period cycles.

5. The method of claim 4, wherein the step of providing a base oscillator input signal further comprises providing a plurality of selectable base oscillator input signals.

6. The method of claim 4, wherein said step of defining selectable aperiodic patterns comprises:

defining a series of naturally occurring waveforms comprised wholly of constant period cycles; and defining incremental patterns with average frequencies between naturally occurring waveforms by extending the period of one or more cycles of said incremental patterns.

7. The method of claim 6, wherein said periods of one or more cycles in said incremental waveforms are extended in even multiples of the period of said base oscillator signal.

* * * * *